April 7, 1970 S. H. MORRALL ET AL 3,505,602

TUNING STRUCTURE FOR TELEVISION RECEIVER

Filed July 11, 1966 3 Sheets-Sheet 1

INVENTORS.
STEPHEN H. MORRALL
WERNER H. WACHOWIAK
PAUL A. NOVAK

BY Hofgren, Wegner, Allen, Stellman & McCord
ATTORNEYS

April 7, 1970 S. H. MORRALL ET AL 3,505,602

TUNING STRUCTURE FOR TELEVISION RECEIVER

Filed July 11, 1966 3 Sheets-Sheet 2

TUNING STRUCTURE FOR TELEVISION RECEIVER

Filed July 11, 1966

United States Patent Office 3,505,602

Patented Apr. 7, 1970

3,505,602

TUNING STRUCTURE FOR TELEVISION RECEIVER

Stephen H. Morrall, Chicago, Paul A. Novak, Wauconda, and Werner H. Wachowiak, Rolling Meadows, Ill., assignors to Warwick Electronics Inc., a corporation of Delaware Filed July 11, 1966, Ser. No. 564,162
Int. Cl. H04b *1/08;* A47b *81/06*
U.S. Cl. 325—352 9 Claims

ABSTRACT OF THE DISCLOSURE

A receiver tuning assembly wherein the tuning dials are usually retracted within the cabinet. A chassis containing the dials which moves into and out of the cabinet with movement of a door covering the chassis opening in the cabinet either over the opening or away from the opening respectively. The channel dial has two intersecting surfaces so that the tuned channel can be seen through a window in the cabinet on one surface when the chassis is within the cabinet and on a second surface when the chassis is extended outside of the cabinet.

This invention relates to television receivers and more particularly to a television tuning apparatus wherein the tuning and adjustment dials are normally masked from the exterior of the television receiver and may be selectively exposed for access to the viewer for periodic tuning adjustment.

Television receivers commonly have a channel tuning dial and at least a few other adjustment dials positioned exteriorly of the cabinet for selection of a desired channel by the viewer and proper adjustment of the signal selected. Continuous efforts have been made to both minimize the number of tuning dials as well as to obscure their projection from the television cabinet. With the advent of color television, a greater profusion of tuning dials has become necessary in that the tint and hue of the colors must be adjusted in addition to the standard tuning functions which must be accomplished.

This invention is directed to a tuning assembly wherein the tuning dials are normally hidden from view so that the cabinet presents a pleasing uncluttered appearance and wherein the dials may be easily exposed to view for access to the viewer to make desired tuning adjustments and corrections.

It is therefore a primary object of this invention to provide a new and improved tuning structure for a television receiver.

It is another object of this invention to provide a new and improved tuning structure for a television receiver wherein the tuning components are normally hidden from view behind a door means and may be selectively exposed for access to perform desired tuning functions by movement of the door relative to the tuning components.

A further object of this invention is to provide a new and improved tuning structure wherein the tuning and adjustment dials are normally positioned to the interior of the cabinet and access to the dials may be gained by opening a door means which normally masks the tuning dials.

Yet another object of this invention is to provide a new and improved tuning structure normally held to the interior of the cabinet of a wave signal receiver which may be brought to the exterior of the cabinet by slidable movement of the tuning structure relative to the cabinet.

A further object of this invention is to provide a new and improved tuning structure for a television receiver which is mounted in the receiver cabinet by means permitting movement of the tuning structure between a first retracted position, interiorly of the cabinet and a second laterally projected position, exteriorly of the cabinet wherein access may be gained to the several tuning dials for desired tuning adjustment.

Still another object of this invention is to provide a new and improved tuning structure for a television receiver wherein the tuning structure is slidably mounted on track means for movement between a first position interiorly of the television receiver cabinet and a second position exteriorly thereof and wherein a door means is mounted on the tuning structure for automatic movement between a first position masking the tuning dials when the tuner structure is in the interior of the cabinet and a second position exposing the tuning dials when the tuning structure is positioned exteriorly of the cabinet.

A further object of this invention is to provide a new and improved channel selection indicator dial wherein the indication of the channel being viewed is simultaneously displayed in different planes.

Other objects, features and advantages of the present invention will be apparent from the following description of the preferred embodiments illustrated in the accompanying drawings, in which.

Figures 1, 5, 7:
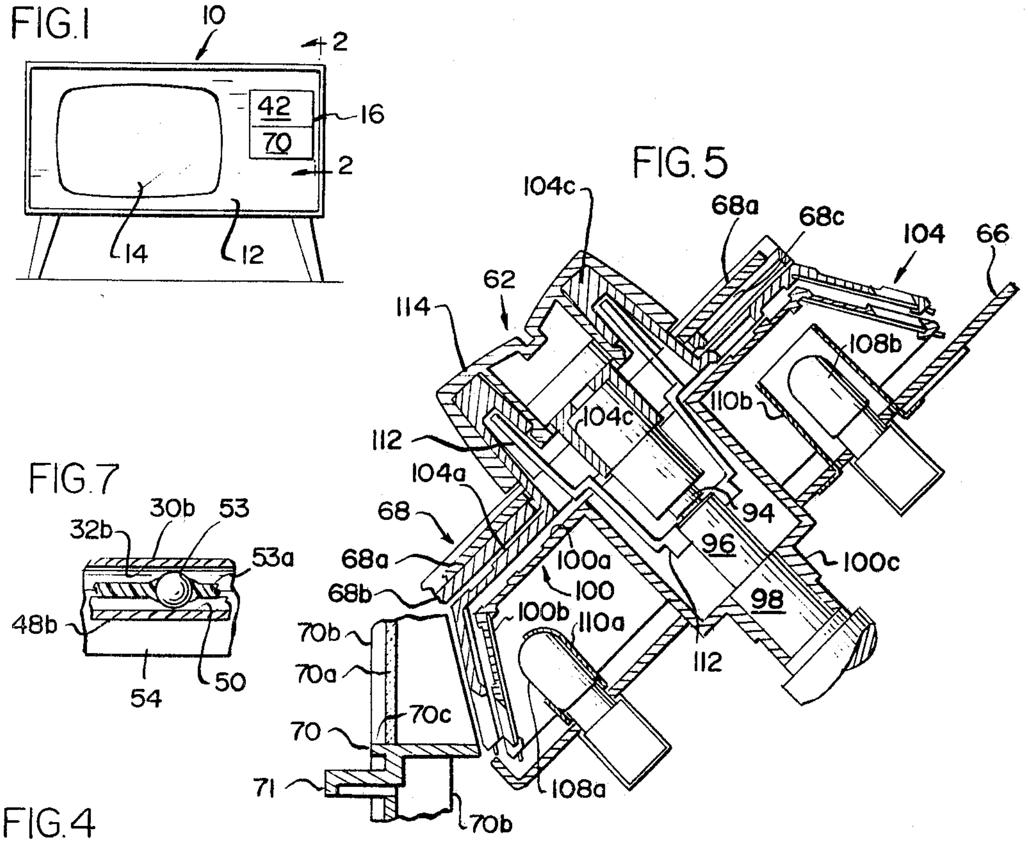
FIGURE 1 is a front elevational view of a television receiver utilizing the tuning structure of this invention.
FIGURE 5 is a fragmentary enlarged sectional view through the channel selection knob portion of the tuning structure of this invention.
FIGURE 7 is a fragmentary enlarged sectional view taken generally along the line 7—7 of FIGURE 2 also illustrating in further detail a portion of the slidable track mounting of the tuner structure.

In FIGURE 1 there is shown a television receiver 10 including a cabinet 12 housing a picture tube 14 for display of the picture signal which may be received. Tuner means 16 is positioned interiorly of an opening **12*a* in cabinet 12** and includes the usual signal receiving and signal adjusting elements.

Figures 2, 3, 8, 9:
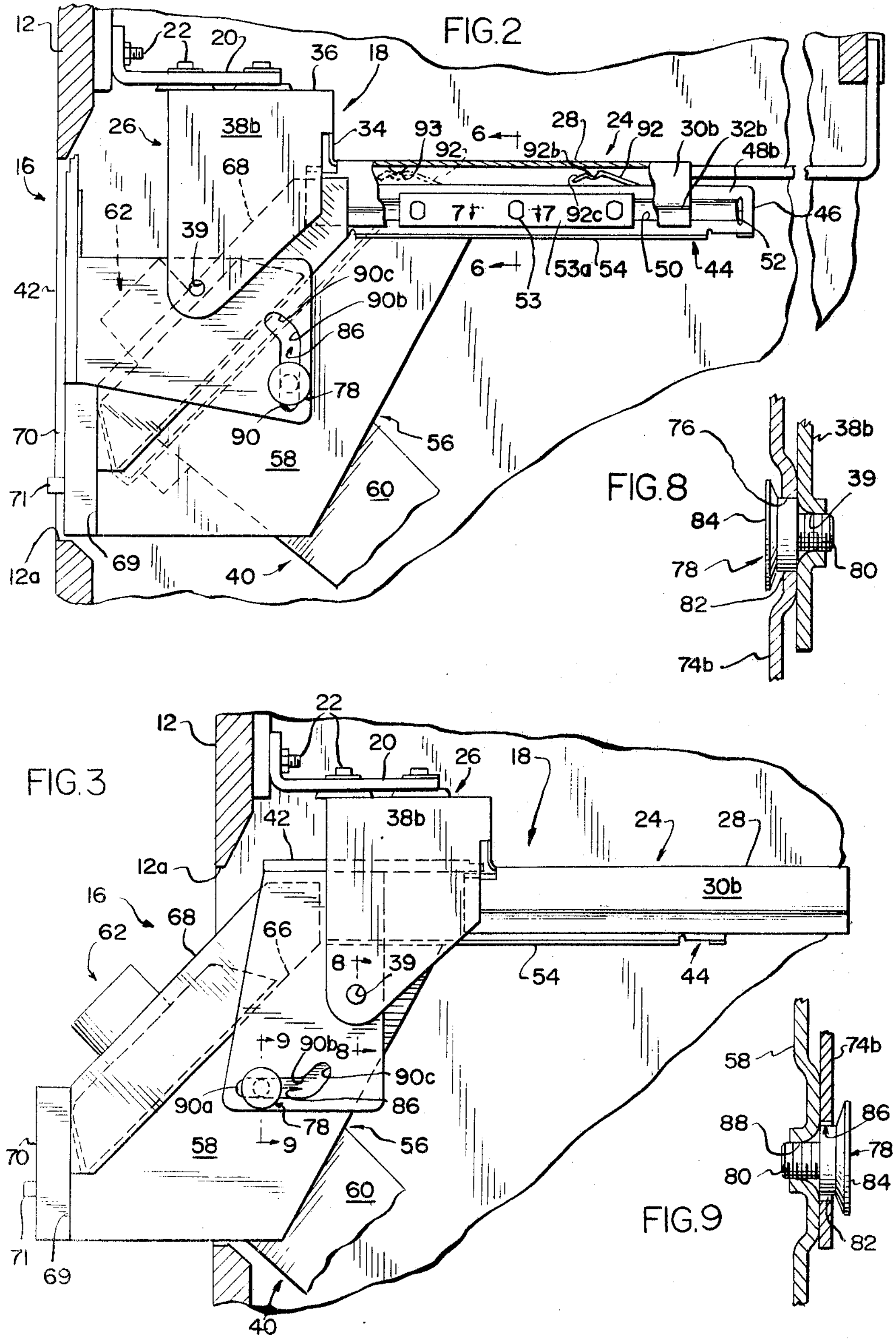
FIGURE 2 is a fragmentary enlarged sectional view taken generally along the line 2—2 of FIGURE 1 showing the tuning structure of this invention retracted inwardly of the television receiver, generally in side elevation.
FIGURE 3 is a fragmentary view similar to FIGURE 2 showing the tuning structure in an extended position projecting exteriorly of the television cabinet.
FIGURE 8 is a fragmentary enlarged view taken along the line 8—8 of FIGURE 3 illustrating the connection between the masking door and the suspending frame.
FIGURE 9 is a fragmentary enlarged section view along the line 9—9 of FIGURE 3 illustrating the connection between the side wall of the housing of the tuner structure and the tuner masking door.
Figure 10:
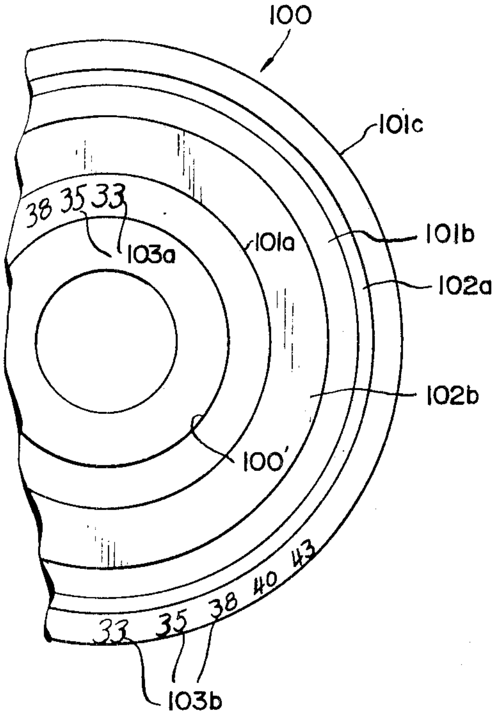
FIGURE 10 is a fragmentary enlarged plan of the UHF channel indicator dial utilized with the tuning assembly of this invention.
Figure 11:
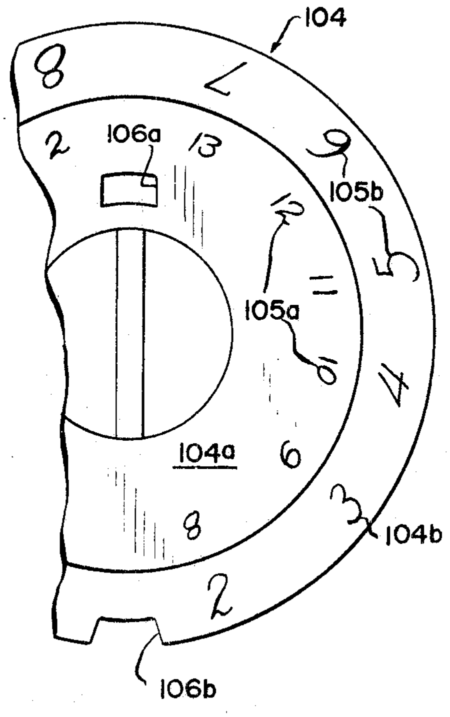
FIGURE 11 is a fragmentary enlarged plan view of the VHF channel indicator dial utilized with the tuning assembly of this invention.

As best shown in FIGURES 2 and 3, tuner means 16 is held suspended from the interior of cabinet 12 by frame means 18. Frame means 18 is secured to the interior of the cabinet by means of a bracket 20 which is connected to the frame means and the interior of the cabinet by suitable fastening means 22.

Frame means 18 includes a rear track portion 24 and a front mounting portion 26. Rear track portion 24 has a shallow elongate channel-like configuration including a wide elongate top portion 28 and narrow elongate depending side walls **30*a* and 30*b*, each of which have longitudinally extending grooves 32*a* and 32*b*, respectively. A front wall 34 extends upwardly from top wall 28 and provides a juncture with mounting portion 26**.

Mounting portion 26 includes a top portion 36, vertically offset relative to top portion 28, to which front wall 34 is connected. A pair of laterally spaced downwardly extending ears **38*a* and 38*b* project from top portion 36 and are each provided with openings 39** near their respective lower ends for a purpose to be explained later.

Frame 18 supports two portions of the tuner means including tuner chassis 40 and door member or panel 42. These two components are supported for movement both relative to the cabinet 12 and relative to each other as the tuner is moved between a masked or first position inwardly of the cabinet and a second or forward position exteriorly of the cabinet wherein access may be gained to the several signal receiving and adjusting or tuning elements.

Figure 12:
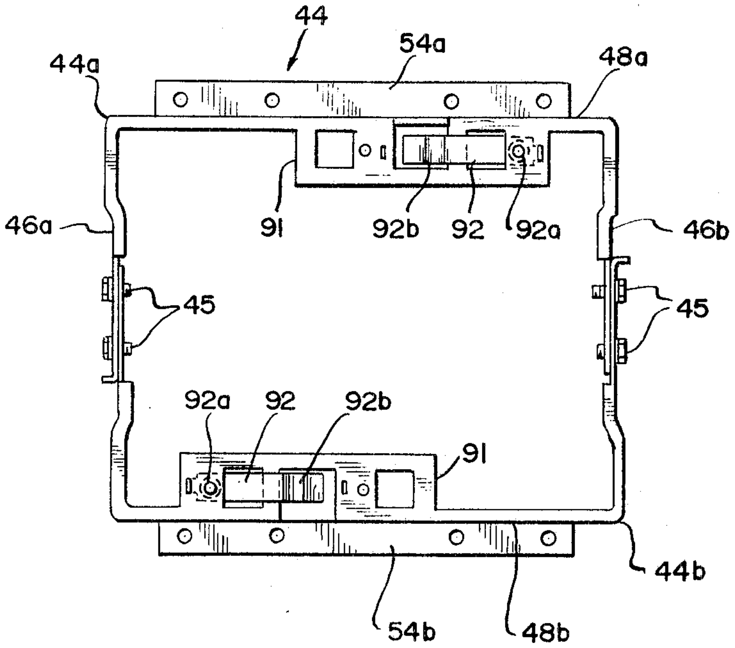
FIGURE 12 is a top plan view of the track frame from which the tuning components are suspended.

Chassis 40 includes a track frame 44 which has a generally rectangular configuration in plan (FIGURE 12) and comprises two identical U-shaped members **44*a* and 44*b* held together by fasteners 45. Frame 44 includes opposed front and rear walls 46*a* and 46*b* as well as opposed generally parallel side channels 48*a* and 48*b*. Each of the side channels 48*a* and 48*b* is provided with longitudinally extending grooves 50 (FIGURES 2, 6 and 7), which terminate at a straight portion 52 of the side walls short of rear wall 46 (FIGURE 2). A plurality of bearings 53 are mounted in a bearing retainer 53*a* positioned between the walls 30*a* and 48*a* and 30*b* and 48*b* so that the bearings 53 reside in the respective grooved portions 32*a*, 50*a* and 32*b*, 50*b*. In this manner, the track frame 44 (and all components secured thereto) is slidably mounted relative to the track portion 24 of the suspending frame 18 and therefore slidably mounted relative to cabinet 12. It is to be understood that all wiring connected to tuning chassis 40 (not shown herein) and leading to other portions of the television receiver will be provided with sufficient slack to permit movement of the tuning chassis 40** between its extended and returned positions.

Figure 6:
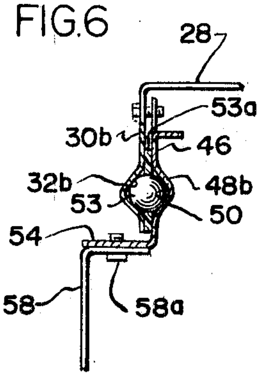
FIGURE 6 is a fragmentary enlarged sectional view taken generally along the line 6—6 of FIGURE 2 illustrating a portion of the slidable track mounting of the tuning structure of this invention.

As shown in FIGURE 6, each of the side channels **48*a* and 48*b* is provided with a lower outwardly extending flange 54 to which tuner chassis housing 56 is secured in the upper area of housing side walls 58 by suitable fastening means 58*a*. The tuner chassis housing 56 supports several signal receiving components 60 and channel selection dial elements 62 (FIGURES 2, 3 and 4) as well as tuning control dials or signal adjustment elements 64** for selecting and properly tuning a picture signal.

With particular reference to FIGURES 2 through 5, the front face 66 of the chassis housing 56 is inclined (relative to a vertical plane in the illustrated embodiment) and is covered with an inclined masking panel 68 composed of a layer of translucent material **68*a* and a layer of opaque material 68*b*. An interruption in the opaque material 68*b* provides a window 68*c* in a position for displaying a channel selection member as will be explained in detail later. Panel 68 also has several openings (not shown) to accommodate tuning elements 64** and suitable decorative tuning knobs which may be attached to the tuning elements in the usual manner.

The lower forward portion 69 of the chassis housing 56 lies in a plane which intersects face 66, being generally vertical in the illustrated embodiment. A masking panel 70 overlies portion 69 and extends thereabove and is also composed of a first translucent layer **70*a* and a second opaque layer 70*b*, interrupted at 70*c* to provide a window for channel number display purposes. A handle means 71 projects outwardly from panel 70 to provide a means grasping the tuner means 16 and moving the same on its slidable mounting relative to the cabinet 12**.

Door panel 42 has a generally flat front face and a pair of spaced, generally parallel, rearwardly extending ears **74*a* and 74*b*, each of which has an opening at 76 intermediate its ends generally in alignment with openings 39 of ears 38*a* and 38*b* (FIGURE 8). Fasteners 78 extend through the openings 76 and the threaded shank portions 80 of the fastener are threaded in the openings 39. Fasteners 78 are further provided with an enlarged bearing portion 82 positioned in the openings 76 and an enlarged head 84 which may be slotted to receive an appropriate fastening tool. In this matter, the door 42 is pivotally mounted relative to frame 18**.

Each ear **74*a* and 74*b* is further provided with a cam slot 86 near its respective rear end. Fasteners 78 also extend through each cam slot 86 with the threaded end 80 of each fastener threadably received in an opening 88 in each side wall 58 of chassis housing 56 (FIGURES 2, 3 and 9). The bearing portion 82 of fastener 78 extends through each of the ears 74*a* and 74*b* and in this manner the ears are movably mounted relative to the chassis housing 56**.

Cam slot 86 is provided with a first relatively elongate straight portion **90*a* which extends generally parallel to the face of door 42, a bend 90*b* and a second shorter canted portion 90*c* which extends towards the face of door 42. This cam slot and movable connection with chassis 56 in combination with the pivotal mounting of the door 42 to the ears 38*a* and 38*b* of frame 18 provides a means responsive to movement of the tuner chassis 40 for moving the door 42 between a first closed position when the chassis 40 is positioned inwardly of the television cabinet 12 and a second unmasking or open position when the tuner chassis 40** is moved exteriorly of the cabinet.

With particular reference to FIGURES 2 and 3, when the chassis 40 is positioned interiorly of the cabinet 12, door panel 42 is upright and, in combination with outside panel 70, bridges the opening **12*a* in cabinet 12 to hide the components of tuner chassis 40 to the interior of the cabinet. When a viewer grips handle 71 to withdraw the tuner means 16 from the interior of the cabinet, masking door 42 will begin to pivot around its connection with the ears 38*a* and 38*b* and in so doing, cam slots 86 will be moved relative to their respective fasteners 78 so that the bend portions 90*b* move toward the fasteners. Continued pulling causes the canted portion 90*c* of cam slot 86 to slide around fastener 78. This occurs when the masking door or panel 42 is approximately parallel to face 66 or mask panel 68. Continued forward extension of the chassis 40 relative to cabinet 12 causes a relative return movement between the cam slot and the fastener 78 so that the fastener returns through the bend portion 90*b* and back to portion 90*a***.

When the tuner is completely withdrawn to the access gaining position, fasteners 78 are in the initial starting position relative to cam slots 86, but each cam slot 86 is in a substantially horizontal position (FIGURE 3) with the door panel 42 also in a horizontal position, swung to the interior of the cabinet 12. The several tuning elements are exposed for access by the viewer so that proper tuning adjustments may be made. Once the desirad tuning adjustments have been accomplished, chassis 40 is merely pushed rearwardly and the reverse of the movements previously described occurs so that the chassis ultimately returns to the position shown in FIGURE 2 with the door panel 42 again masking panel 68 and its several tuning elements.

Means are provided for limiting the outward extension of the tuning chassis relative to the cabinet. For this purpose, inwardly flanged portions 91 of frame 44 bear leaf members 92 which are secured to the flange portions 91 by suitable fasteners **92*a*. As best seen in FIGURE 2, the free ends of the leaf members are transversely notched at 92*b* leaving a downwardly facing cam portion 92*c*. Top portion 28 of frame means 18 is provided with downwardly facing detents 93 arranged to engage notches 92*b* as surface 92*c* deflects leaf member 92 during relative lateral movement between the track 44 and frame 18. When tuner chassis 40 is positioned exteriorly of the cabinet, leaf member 92 will engage detent 93 (as shown in dotted outline in FIGURE 2 for clarity of illustration), preventing further outward movement of the chassis 40 relative to cabinet 12. Both notch 92*b* and detent 93** are generally rounded to permit easy disengagement of the leaf member relative to the detent responsive to manual effort to return the tuner chassis to the interior of the cabinet.

Because the tuning structure is sometimes within the interior of the cabinet and other times is being tuned when it is to the exterior, it is desirable to have a means for displaying the number of the channel being viewed when the structure is in both positions. To this end, the unique dial display arrangement of this invention is directed.

Referring to FIGURE 5, the channel selection dials 62 are intended for operation in conjunction with a VHF tuner shaft 94 and a UHF and fine tuning shaft 96 as well as a UHF display drive shaft 98. UHF display dial 100 has a generally frusto-conical configuration including a flat face **100*a* having a central opening 100′ and an annular conical skirt 100*b* (FIGURE 5). UHF display dial 100 is further provided with a portion 100*c* which extends rearwardly from opening 100′ and is telescoped on UHF display drive shaft 98 for rotation as shaft 98** is turned.

The face of UHF dial 100 has a plurality of generally concentric, opaque bands **101*a*. 101*b* and 101*c* and a plurality of generally concentric translucent bands 102*a* and 102*b*, between the opaque bands. First opaque band 101*a* is located in the flat face 100*a* closest to the center of the dial and contains a plurality of channel indication numbers 103*a* which are preferably formed as partially translucent portions of the band. First translucent band 102*a* is also in the flat face 100*a* and second opaque band 101*b* spans the juncture of the flat face and the frusto-conical skirt portion, bordering second translucent band 102*b* in the skirt portion immediately above third opaque band 101*c*. The third opaque band 101*c* also contains a plurality of channel indication numbers 103*b*, these numbers preferably being formed as translucent portions of the opaque band and positioned 180° out of phase with the numbers on band 101*a*. In this manner the same UHF channel number will be positioned uprightly at the top of band 101*a* and at the bottom of band 101*c***, in different or intersecting planes.

Figure 4:
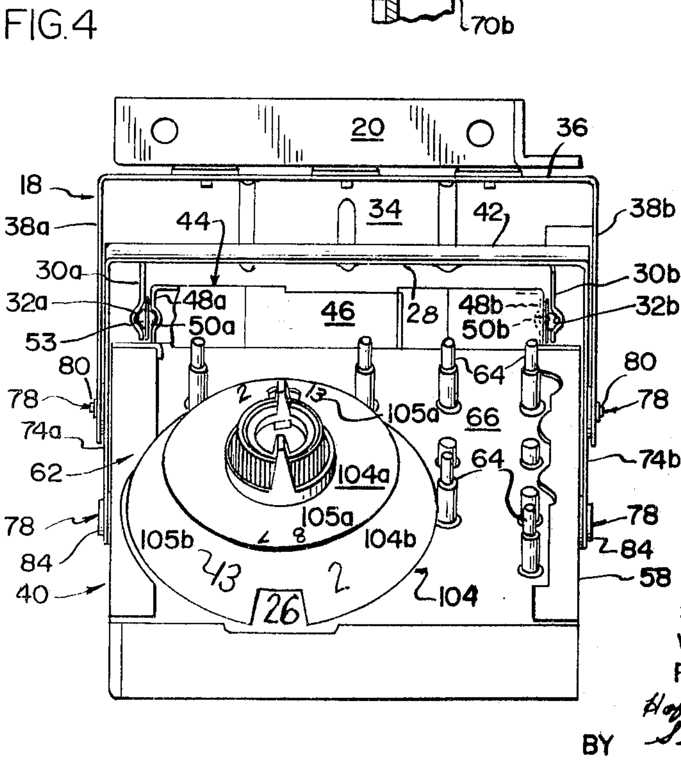
FIGURE 4 is a front elevational view of the tuning structure with portions removed for clarity of illustration.

VHF display dial 104 also has a generally frusto-conical configuration including a flat face **104*a* and a conical skirt 104*b* (FIGURES 4 and 5). The dial is further provided with a bridging and VHF shaft gripping portion 104*c* (FIGURE 4) so that it can be attached directly to the VHF tuning shaft at 94, overlying UHF dial 100. Preferably the VHF dial is opaque, save for the first band of VHF channel indication members 105*a* formed on face 104*a* and the second band of channel indication numbers 105*b* formed on skirt portion 104*b*. As is the case with the UHF dial, preferably the channel members are formed with the two bands 180° out of phase with each other so that the same channel number may be simultaneously displayed uprightly at the top of band 104*a* and at the bottom of band 104*b* in different or intersecting planes. Because the dial is substantially opaque, it serves to mask the translucent portions, including the numbers, of UHF dial 100, and the translucent number portions 105*a* and 105*b* are so constructed as to overlie the translucent bands 102*a* and 102*b* of the UHF dial 100**.

The VHF dial 104 is provided with a first window **106*a* in face 104*a* generally in radial alignment with the band of numbers 103*a* on UHF dial 100, and a second window 106*b* in band 104*b* generally in radial alignment with the band of numbers 103*b* on UHF dial 100. Windows 106*a* and 106*b* are arranged so that when the VHF dial 104 is turned to position window 106*a* and 106*b* under windows 68*c* and 70*c*, the signal receiving component 60 will be in a UHF receiving mode with the UHF channel numbers 103*a* and 103*b* displayed to view through the windows 106*a*–68*c* and 106*b*–70*c***, respectively.

Light bulbs **108*a* and 108*b* are positioned interiorly of UHF dial 100 to provide a source of light to illuminate the translucent portions of the dial so that the numbers may be viewed. Preferably these bulbs are each provided with an appropriate shroud structure 110*a* and 110*b*** to limit the illumination to the area of the dials immediately adjacent the bulbs.

A UHF and fine control knob 112 is nested within the bridge portion of VHF dial 104 and has an end **112*a* which is constructed for telescoping engagement with UHF and fine tuning drive shaft 96 to provide a means for turning shaft 96. VHF tuning knob 114 is constructed to matingly engage the bridge portion of VHF dial 104 to provide a means for driving VHF tuning shaft 94**.

When the tuning means 16 is in the interior of the cabinet, the numerical representation of the channel to which signal receiver 60 is turned may be displayed through the window **70*c* of panel 70. When the tuner means 16 is withdrawn and positioned exteriorly of the cabinet, it can be readily appreciated that it would be inconvenient, if not difficult, for the viewer to bend over and attempt to read the number of the channel being tuned from panel 70. For this reason, dial display in a second plane through inclined panel 68** is provided. Thus the numerical representation of the channel to which the signal receiver is tuned may be easily read from a standing or upright position when the tuner is positioned exteriorly of the cabinet for suitable channel selection or signal tuning adjustment.

This invention provides a novel means for mounting a tuning assembly in a television receiver so that the assembly and its associated channel selection and tuning adjustment dials and knobs may be hidden from view to present a clean, uncluttered appearance. However, when so hidden, the numerical representation of the channel being tuned is still readily discernible from the exterior of the cabinet. A viewer may gain access to the tuning panel for making the desired tuning adjustment by means of a pivoted door which, in the embodiment illustrated, swings to the interior of the cabinet when the tuning chassis is pulled outwardly from the cabinet. In this second, access gaining position, the number of the channel being viewed is displayed in the plane of the surface having the tuning adjustment elements so that the viewer may easily discern what channel is being selected while performing the tuning adjustment function.

The foregoing detailed description has been given for clearness of understanding only, and no unnecessary limitations should be understood therefrom, as some modifications may be obvious to those skilled in the art.

We claim:

1. A tuning adjustment assembly for use with a wave signal receiver having a cabinet and a signal receiving apparatus within said cabinet, comprising: a tuning chassis, means for mounting said chassis in said cabinet for movement between a retracted position interiorly of the cabinet and an extended position exteriorly of the cabinet said chassis having first and second intersecting surfaces, said first surface comprising a tuning panel, and signal receiving apparatus connected thereto, said chassis further including a plurality of tuning adjustment elements extending exteriorly of said tuning panel and associated with said signal receiving apparatus for adjusting the tuning point of said receiving apparatus, said chassis further including means for presenting a visual indicaation of the signal to which said receiving apparatus is tuned at both said surfaces; an opening in one wall ot said cabinet for providing access to said tuning chassis, said second surface being essentially parallel to said one wall when said chassis is in said second retracted position; and door means for covering said panel, said door means being connected to said chassis for movement relative thereto between a first position spanning a limited portion of said opening to cover said panel and allow viewing of said second surface, said door and second surface cooperating to occupy substantially all of said opening when the chassis is in the first retracted position, and a second position away from said opening when said chassis is moved to said second extended position.

2. A tuning assembly as specified in claim 1 and further incorporating a window in each of said first and second surfaces and a channel indicating dial positioned interiorly of said first and second surfaces, said dial having intersecting indicia bearing surfaces generally corresponding to the plane of said first and second surfaces so that channel indicia may be displayed through said window in said second surface and viewed from the exterior of the cabinet when the tuning chassis is positioned interiorly of the cabinet and also displayed through said window in said first surface and viewed therefrom when said tuning chassis is withdrawn from the cabinet for tuning purposes.

3. A tuning assembly as specified in claim 1 wherein said means for presenting a visual indication of the signal to which said receiving apparatus is tuned at both surfaces consists of a dial composed of a top surface and a depending skirt, said skirt being a surface of revolution and said top surface being defined by the intersection of a plane and said surface of revolution; said channel indicating dial having indicia located on said skirt, and corresponding indicia on said top surface, the indicia being viewable respectively from the skirt of the dial when the chassis is in said retracted position, and from the top surface when the chassis is in said extended position exteriorly of said cabinet.

4. A tuning assembly as specified in claim 1 wherein said means for mounting said chassis includes means to confine the movement of said chassis to rectilinear motion.

5. The tuning adjustment assembly of claim 1 wherein the door means is connected to means associated with the cabinet opening for moving interiorly of the cabinet opening when the tuning chassis is moved exteriorly therefrom.

6. A tuning adjustment assembly for use with a wave signal receiver having a cabinet and signal receiving apparatus within said cabinet, comprising a frame mounted on said cabinet: a tuning chassis movably mounted on said frame for movement between a first retracted position interiorly of the cabinet and a second extended position exteriorly of the cabinet, said chassis having a tuning panel and signal receiving apparatus connected thereto, said chassis further including a plurality of tuning adjustment elements extending exteriorly of said tuning panel and associated with said signal receiving apparatus for adjusting the presentation of the signal received; an opening in said cabinet for access to said tuning panel, and door means for covering said panel, said door means having a front panel and rearwardly extending ears, said ears having slots therein, each said slot having a first portion generally parallel to the front panel and a second portion canted relative to said first portion; and means for mounting said door for automatic movement between a first position spanning said opening and covering said tuning panel and a second position away from said opening when said chassis is moved between said retracted and extended positions comprising means for pivotally mounting said door means to said frame and pin means on said chassis, said pin means extending through said slots in said ears, said pins moving to and fro in said slots during movement of the door means.

7. The tuning adjustment assembly as specified in claim 6 wherein the tuning panel is inclined and the tuning chassis has a lower face viewable from the exterior of the cabinet when the door means is closed and the tuning chassis is positioned interiorly of the cabinet, and wherein both said lower face and said inclined tuning panel are provided with window means, a channel indicating dial positioned interiorly of said lower face and tuning panel and having intersecting indicia bearing surfaces generally corresponding to the planes of the lower face and inclined tuning panel of the tuning chassis so that channel indicia may be displayed through said lower face and viewed from the exterior of the cabinet when the tuning chassis is positioned interiorly of the cabinet and also displayed through said inclined tuning panel and viewed therefrom when said tuning chassis is withdrawn from the cabinet for tuning purposes.

8. A channel indication tuning dial assembly for use with a wave signal receiver, comprising: first and second dial display shafts responsive to movement of first and second tuning means; first and second channel display dials connected to said first and second shafts, each of said channel display dials having a plurality of sets of channel indication numbers, each of said sets of numbers of each dial being formed out of phase with the other set of numbers of each respective dial to afford simultaneous presentation of channel indicia at spaced points and further wherein each of said dials is provided with a plurality of planar surfaces, said sets of channel indication numbers being disposed in different planes of the dials to afford simultaneous presentation of channel indicia in different planes, said dials being nested one within the other, the outer dial masking the inner dial, the outer dial having a window portion in each of said planes, said window portions being in registration with the indicia of the second inner dial to permit simultaneous display of the same channel indication numbers of the second inner dial.

9. The tuning dial assembly of claim 8 wherein each of said dials has a generally flat face and a depending frusto-conical wall, one set of channel indication numbers of each dial being formed in each face, and the other set of channel indication numbers of each dial being formed in each depending wall with the two sets of numbers of each dial formed approximately 180° out of phase from each other, and the display shafts are connected to a tuning chassis mounted in a cabinet for movement inwardly and outwardly of the cabinet, the chassis having a lower face viewable from the exterior of the cabinet when the tuning chassis is positioned interiorly of the cabinet and an upper inclined dial panel viewable when the tuning chassis is positioned exteriorly of the cabinet, said channel indicating dials being positioned interiorly of said lower face and dial panel and the intersecting planes of said channel indicating dial generally corresponding to the planes of the lower face and inclined dial panel of the tuning chassis, so that channel indicia may be displayed through both said lower face and viewed from the exterior of the cabinet when the tuning chassis is positioned interiorly therefrom and also displayed through said inclined face and viewed therefrom when said tuning chassis is withdrawn from the cabinet for tuning purposes.

References Cited

UNITED STATES PATENTS

| | | | |
|---|---|---|---|
| 2,331,166 | 10/1943 | Braun | 312—8 |
| 2,350,889 | 6/1944 | Harman | 178—7.5 |
| 2,707,222 | 4/1955 | Brown et al. | 201—56 |
| 2,745,708 | 5/1956 | Cornish | 312—311 |
| 2,859,725 | 12/1958 | Genasci | 116—124 |
| 3,179,907 | 4/1965 | Brand et al. | 334—1 |
| 3,183,885 | 5/1965 | Venema | 116—124 |
| 3,294,906 | 12/1966 | Swanson | 178—7.9 |

WILLIAM C. COOPER, Primary Examiner

C. JIRAUCH, Assistant Examiner

U.S. Cl. X.R.

312—7